United States Patent [19]

Sawahata et al.

[11] Patent Number: 4,956,693
[45] Date of Patent: Sep. 11, 1990

[54] SEMICONDUCTOR DEVICE

[75] Inventors: Yasuo Sawahata; Ryuichi Saito; Naohiro Momma, all of Hitachi, Japan

[73] Assignee: Hitachi, Ltd., Tokyo, Japan

[21] Appl. No.: 28,140

[22] Filed: Mar. 19, 1987

[30] Foreign Application Priority Data

Mar. 20, 1986 [JP] Japan ................................ 61-60542

[51] Int. Cl.$^5$ ........................................ H01L 29/167
[52] U.S. Cl. ........................................ 357/64; 357/43; 357/91
[58] Field of Search ................ 357/43, 91, 63, 64; 437/24, 26

[56] References Cited

U.S. PATENT DOCUMENTS

| | | | |
|---|---|---|---|
| 3,622,382 | 11/1971 | Brack et al. | 437/26 |
| 4,053,925 | 10/1977 | Burr | 357/64 |
| 4,082,571 | 4/1978 | Graul et al. | 148/1.5 |
| 4,490,182 | 12/1984 | Scovell | 437/26 |
| 4,559,696 | 12/1985 | Anand et al. | 437/24 |
| 4,689,667 | 8/1987 | Aronowitz | 357/63 |
| 4,694,321 | 9/1987 | Washio et al. | 357/92 |

FOREIGN PATENT DOCUMENTS 0147626  7/1985  Japan .................... 357/43

OTHER PUBLICATIONS

IBM Technical Disclosure Bulletin, vol 27, #8, by Martin, Jan. 1985, pp. 4693–4694.
IBM Technical Disclosure Bulletin, vol. 20, #1, by Brach et al., Jun. 1977, p. 230.
IBM Technical Disclosure Bulletin, vol 21, #8, by Chu et al., Jan. 1979, pp. 3154–3156.
IEEE Transactions on Electron Devices, vol. 33, #3, pp. 354–360, Mar. 1986, Foster et al.
IEEE Transactions on Electron Devices, vol 28, #9, pp. 1084–1087, Sep. 1981, by Ohwada et al.

Primary Examiner—Andrew J. James
Assistant Examiner—Mark Prenty
Attorney, Agent, or Firm—Antonelli, Terry, Stout & Kraus

[57] ABSTRACT

Disclosed is a semiconductor device having a support region, an element-forming region (e.g., an epitaxial layer) and a buried layer between the support region and the element-forming region, with at least one of a MOS element and a bipolar element being formed in the element-forming region. The feature of the present invention resides in that atoms of at least one element selected from oxygen, nitrogen, carbon, argon, neon, krypton and helium is contained in a layer in at least one of the element-forming region and the buried layer, so as to suppress auto-doping of impurities from the buried layer into the element-forming region and suppress swelling of the buried layer.

6 Claims, 4 Drawing Sheets

SEMICONDUCTOR DEVICE

BACKGROUND OF THE INVENTION

The present invention relates to a semiconductor device, and more specifically to a semiconductor device having MOS elements and bipolar elements in a semiconductor substrate which consists of a buried layer formed between an element-forming region and a support region, and a method of forming such device.

In a semiconductor integrated circuit which consists of an MOS element, or a bipolar element, or both of them provided in an element-forming region of a semiconductor substrate, provision is made of an n-type buried layer that is used as a subcollector of an npn bipolar element; a p-type buried layer for preventing soft error which is located between a p-type well (element-forming region) of an NMOS element and a support region, which buried layer works to isolate the element from other elements and which further prevents carriers generated by alpha particles from infiltration; an n-type buried layer which is located between an n-type well (element-forming region) of a PMOS element and the support region and which works like the above-mentioned layer; or a p-type buried layer which isolates the elements between bipolar elements or between the bipolar element and the PMOS element. The buried layers must have a high concentration so that they will work favorably. From the standpoint of forming fine elements, furthermore, the buried layers must have a high concentration in compliance with the scaling rule of LSI's. In compliance with the scaling rule of LSI's, on the other hand, it becomes essential to reduce the thickness of the epitaxial layer that serves as an element-forming region. In particular, to improve characteristics of the bipolar element, the thickness of the epitaxial layer must be reduced to one micron or smaller. When a thin epitaxial layer is grown on the buried layer of a high concentration, however, impurities of the buried layer are diffused into the epitaxial layer due to the auto-doping effect, and the impurity concentration of the epitaxial layer serving as an element-forming region often changes. Such a change in the impurity concentration deteriorates the element characteristics, such as causing the threshold voltage of the MOS element to vary. If the impurity concentration of the buried layer decreases due to auto-doping, it becomes difficult to prevent the occurrence of soft error Further, since the thickness of the buried layer increases, giving rise to the occurrence of so-called swelling of the buried layer and causing the thickness of the element-forming region to decrease, it is necessary to form a thick epitaxial layer in advance. In order to cope with such problems, there have been proposed a reduced-pressure epitaxial method, a high-temperature prebaking method in hydrogen, and a like method. These methods have been taught in Japanese Patent Publication Nos. 12010/1981 and 27757/1984.

According to the above patent publications, the auto-doping can be reduced during the epitaxial growing without, however, enabling an epitaxial film to be obtained having quality sufficient for favorably operating fine elements. Moreover, consideration has not at all been given with regard to swelling of the buried layer, wherein impurities of the buried layer transfer into the epitaxial film due to heat treatment after forming the epitaxial film, in the process for producing the elements. In particular, no effective measure has been taken to cope with the fact that the buried layer swells conspicuously due to the thermal oxidation effected at a high temperature for an extended period of time to isolate the elements.

SUMMARY OF THE INVENTION

The object of the present invention is to provide a semiconductor device, and method of forming such device, which suppresses the buried layer from the swelling that will be caused by the auto-doping at the time of epitaxial growing, by the thermal diffusion and by the subsequent heat treatment in the process for manufacturing the elements, and which is adapted to improve MOS characteristics, to decrease the isolation width among fine bipolar elements, and to highly densely integrate the elements.

The above object is achieved by having impurities of at least one element (that is, atoms of such at least one element) among oxygen, nitrogen, carbon, argon, neon, krypton and helium contained in at least a sub-region (layer) of the element-forming region (the element-forming region being, e.g., an epitaxial layer formed on a buried layer) and/or contained in at least the buried layer beneath the element-forming region.

If at least either one of the buried layer or the element-forming region is provided with a region containing atoms of at least one element among oxygen, nitrogen, carbon, argon, neon, krypton or helium, the impurity in the buried layer is coupled with the atoms of the element that is introduced, or the introduced atoms of the element serve as a barrier against diffusion of the impurities of the buried layer, whereby the auto-doping of impurities from the buried layer and the swelling are suppressed. For example, the swelling of the buried layer can be prevented by the layer containing the impurities such as oxygen, nitrogen and argon. Further, the resistance of the buried layer increases little. Therefore, the MOS characteristics can be improved, the bipolar elements can be finely formed, the width for isolating the elements can be reduced, and the elements can be highly densely integrated.

A illustrative of the present invention (the present invention is not to be limited thereby), where the impurities are formed as a sub-layer of the buried layer, such sub-layer preferably has a thickness of 0.2μm through 0.5μm (for comparison, the thickness of the buried layer is, e.g., in the range of 2μm-3μm). However, the thickness of such sub-layer is not to be limited to this range of 0.2-0.5μm, and, moreover, is desirably as thin a possible while still providing the function of preventing swelling of the buried layer.

As compared with the thickness of the sub-layer of impurities such as oxygen, nitrogen and argon, etc. when formed in the buried layer, the thickness of the layer of such impurities when formed in the element-forming region (for example, in the epitaxial layer) is relatively thin. The ability to use relatively thin layers containing atoms of at least one of the stated impurities, in the epitaxial layer, while still achieving the benefits of the present invention, is particularly advantageous in relatively large-scale integrated circuits having small semiconductor elements. As can be appreciated, as the size of the element becomes smaller, the thickness of the epitaxial layer (in which the element is formed) becomes thinner. For example, in the case of a Bi-CMOS device, the epitaxial layer is 1.5μm thick when the elements are 2.0μm, but is 1.2μm when the elements are 1.3μm. The advantages of the present invention can be achieved, where the layer containing atoms of at least one of the stated impurities is located in the epitaxial layer, even though the size of the elements is decreasing (and, correspondingly, the thickness of the epitaxial layer is decreasing).

DETAILED DESCRIPTION OF THE EMBODIMENTS

Figure 1:
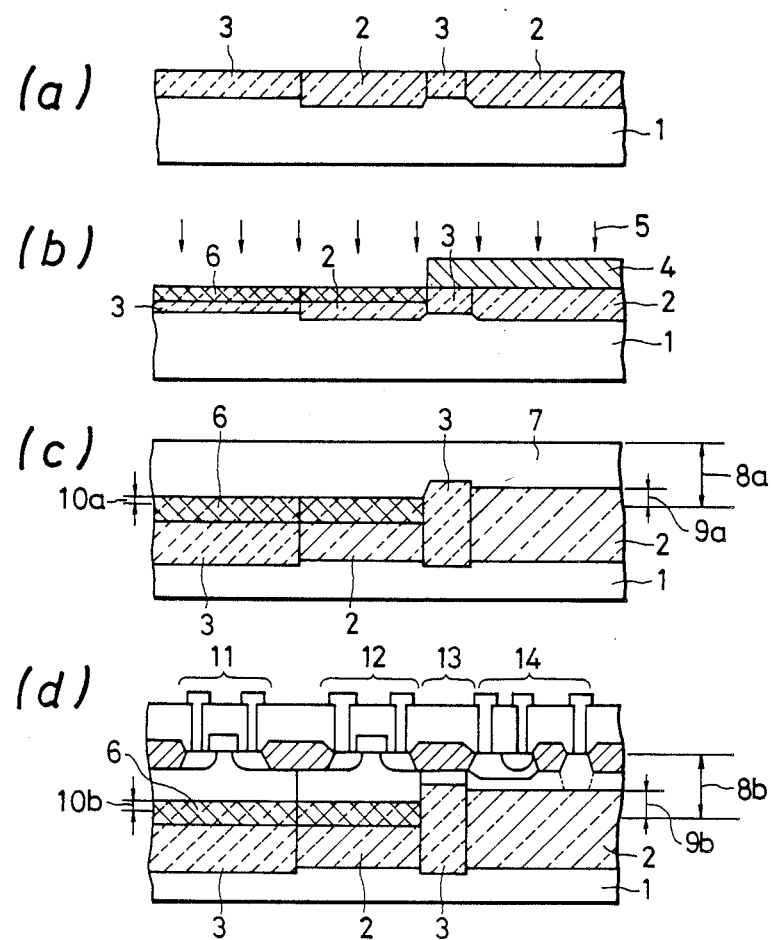
FIGS. 1a-1d are section view illustrating the steps for fabricating a semiconductor element according to an embodiment of the present invention.

An embodiment of the present invention will now be described in conjunction with FIG. 1. Referring, first, to FIG. 1(a), n-type impurities such as antimony ions are diffused into a p-type silicon substrate 1 that serves as a support region, to form an n+-type buried layer 2 (for example, having an impurity concentration of $10^{18}-10^{19}$ atoms/cm$^3$), followed by the diffusion of p-type impurities such as boron ions to form p+-type buried layers 3 (for example, having an impurity concentration of $10^{16}-10^{17}$ atoms/cm$^3$). The technique for forming the buried layers can be that conventionally used. Then, as shown in FIG. 1(b), an ion implanting mask 4 composed, for example, of photoresist is formed on the portions corresponding to a region where a bipolar element will be formed and to an element isolation region, and ions 5 of at least one kind selected from oxygen, nitrogen, carbon, argon, neon, krypton and helium, are implanted into the regions other than the bipolar element-forming region and the element isolation region. The implanting conditions are as follows: i.e., the ions are implanted at an acceleration voltage such that the ion-implanted region extends near to the surface of the buried layer, and at a concentration which permits a single crystalline silicon epitaxial layer of good quality to be grown on the buried layer without forming an insulation layer on the implanted layer 6 and, preferably, at a concentration of $1 \times 10^{18}$/cm$^3$ to $5 \times 10^{22}$/cm$^3$. The acceleration voltage depends on the implanted ions. For example, where oxygen is implanted in a procedure as shown in FIG. 1(b), the acceleration voltage is in a range of 10 through 100 KeV. Moreover, as can be seen in, e.g., FIG. 1(b), the upper surface of the ion-implanted layer 6 can extend to the surface of the buried layer 3.

After ion-implantation to form ion-implanted layer 6, the formed structure can then be subjected to annealing, for example, so as to reduce damage to the crystal structure caused by the ion implantation. For example, the formed structure can be subjected to annealing at a temperature of 900°-1000° C.

Next, as shown in FIG. 1(c), after the implanting mask 4 is removed, a single crystalline silicon layer 7 is epitaxially grown. At this moment, the n+-type buried layer 2 and the p+-type buried layer 3 are swollen due to auto-doping of impurities and thermal diffusion of impurities. The swelling amount 10a of the region where the ions are implanted to suppress the impurities from diffusing is smaller than the swelling amount 9a of the region where the ions are not implanted. For example, in a Bi-CMOS process, the amount of swelling is in the range of 0.5–0.7μm where the ions are not implanted to form the ion-implanted layers, and 0.1–0.3μm where the ion-implanted layers 6 have been formed. Of course, these members, for a Bi-CMOS process, are only illustrative, and the amount of swelling depends on the amount of heat treatment in the semiconductor element-forming process.

Thereafter, the elements are isolated, the diffused layer is formed and the wiring is formed to obtain a structure having NMOS element 11, PMOS element 12, element isolation region 13 and a bipolar element 14, as shown in FIG. 1(d). In this case, the swelling amount 10b of the implanted layer 6 is suppressed though the swelling amount 9b of the element isolation region 13 and of the bipolar element 14 further increases due to heat treatment in the process for fabricating the elements. Reference characters 8a and 8b in FIGS. 1(c) and (d) represent the original thickness of the epitaxial layer.

In putting the present invention into practice as shown in FIG. 1, the buried layer of the MOS element can be suppressed from swelling, the junction capacity is not increased, and the shift in the threshold voltage can be decreased. Moreover, since the concentration of the buried layer can be increased, the width of the element isolation region 13 can be decreased. As for soft error caused by alpha particles, the implanted layer 6 serves as a barrier for the carrier contributing to increasing resistance against the alpha particles. Due to the gettering by the implanted layer 6, furthermore, the epitaxial film exhibits good crystallinity. In this regard, the above-described annealing reduces the damage caused by the ion implantation in forming implanted layer 6, but some damage remains; such remaining damage acts as getters in implanted layer 6.

Figure 2:
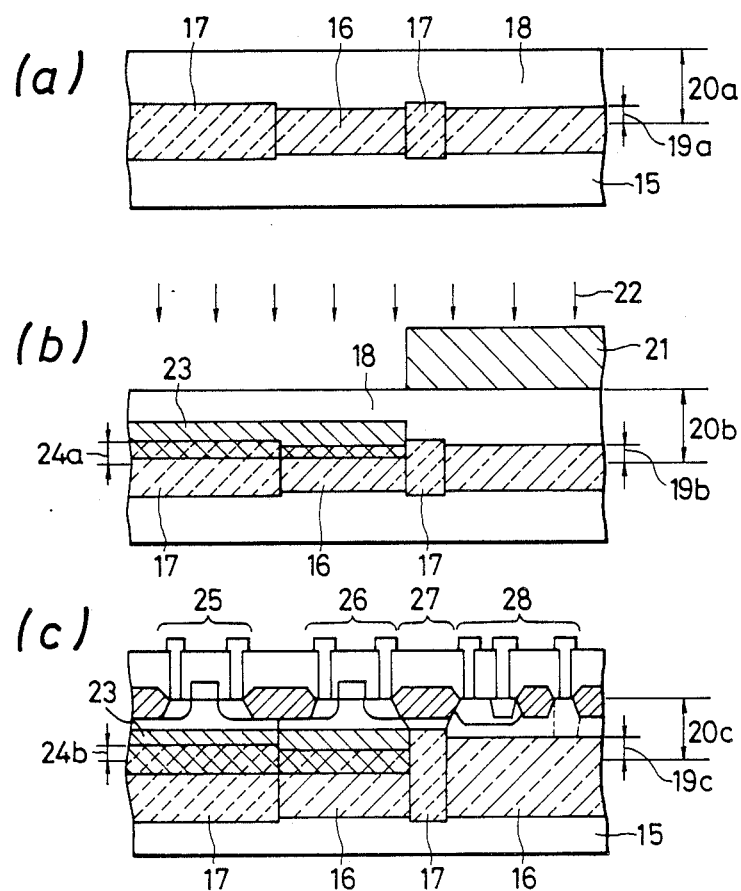
FIG. 2a-2c are a section view illustrating the steps for fabricating a semiconductor element according to another embodiment of the present invention.

FIG. 2 illustrates another embodiment according to the present invention. First, an n+-type buried layer 16 and a p+-type buried layer 17 are formed in a p-type silicon substrate 15 in the same manner as the manufacturing process mentioned with reference to FIG. 1(a), and, then, a single crystalline silicon layer 18 is epitaxially grown, as shown in FIG. 2(a). Then, as shown in FIG. 2(b), an ion implanting mask 21 composed, for example, of photoresist is formed on the bipolar element-forming region and on the element isolation region, and ions of at least one kind of element selected from oxygen, nitrogen, carbon, argon, neon, krypton and helium are introduced (see reference character 22 in FIG. 2(b), showing ion implantation of ions of such elements). The ions are preferably implanted under the conditions of an acceleration voltage which forms an implanted layer 23 in the epitaxial layer near the interface between the buried layer 16 and the epitaxial layer 18 and near the interface between the buried layer 17 and the epitaxial layer 18, and at a concentration which does not form an insulator, preferably, at $1 \times 10^{18}$/cm$^3$ to $5 \times 10^{22}$/cm$^3$. Thereafter, the elements are isolated, a diffused layer is formed, and a wiring is formed to obtain a structure having NMOS element 25, PMOS element 26, an element isolation region 27 and a bipolar element 28, as shown in FIG. 2(c). In FIGS. 2(a)-(c), reference characters 19a, 19b and 19c represent the increase in thickness of the buried layer (swelling) after epitaxial layer growth; reference characters 20a, 20b and 20c represent the original epitaxial layer thickness; and reference characters 24a and 24b respectively represent the amount of swelling of the p+-buried layer after epitaxial growth and after element-forming.

Figure 3:
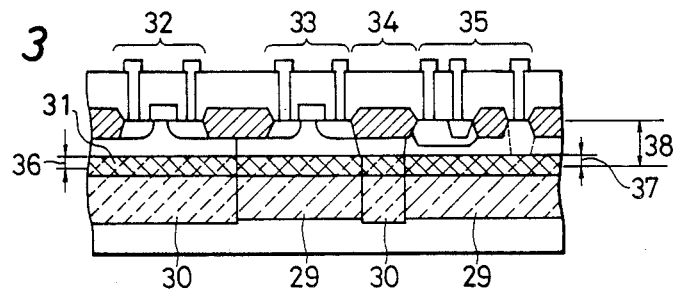
FIGS. 3-8 are section views of semiconductor elements formed according to further embodiments of the present invention.

Referring to FIG. 3, an n+-type buried layer 29 and a p+-type buried layer 30 are formed in the same manner as the fabrication process mentioned with reference to FIG. 1(a), and into the whole surface are implanted atoms of at least one kind of element selected from oxygen, nitrogen, carbon, argon, neon, krypton and helium. The conditions of implanting and the subsequent process for fabricating the elements are the same as those described with reference to FIG. 1. An implanted layer 31 helps suppress the whole buried layer from swelling. This makes it possible to reduce the thickness of the epitaxial layer, and the reduced junction depth makes it possible to reduce the heat treatment and to increase the degree of integration. In FIG. 3, reference characters 32–35 respectively denote the portion for forming an NMOS element, the portion for forming a PMOS element, the portion for the isolating element and the portion for forming a bipolar transistor; reference characters 36 and 37 respectively denote the amount of swelling of the p+- and n+-buried layers; and reference character 38 represents the original epitaxial layer thickness.

Figure 4:
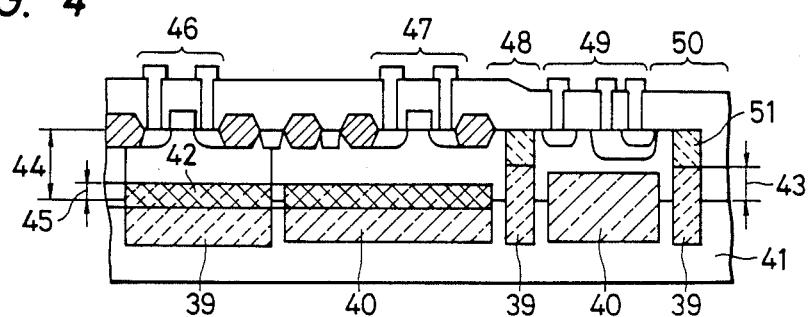
Figure 5:
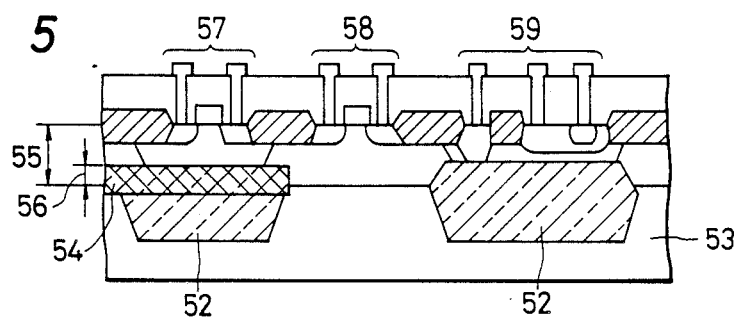
Figure 6:
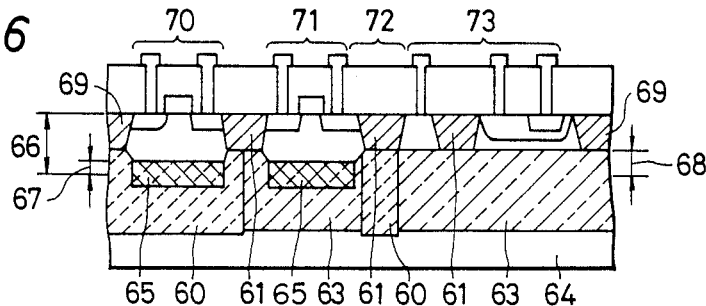

FIGS. 4, 5 and 6 illustrate other embodiments of the present invention. In FIGS. 4–6, reference character 47 represents a portion for forming a PMOS element; 48 and 72 represent portions for isolating elements; 49 and 73 represent portions for forming bipolar transistors; 41 and 53 represent a p-type Si substrate; 42 and 54 represent ion-implanted layers (corresponding to ion-implanted layer 6 in FIG. 1(b)); and 58 represents a portion for forming an NMOS element. Further in FIGS. 4–6, reference characters 44, 55 and 66 represent the original thickness of the epitaxial layers; 45 and 67 represent the relatively minimal amount of swelling at the location of the implanted layer; 43 and 68 represent the amount of swelling of the n+-buried layer; and 60, 61 and 63 respectively represent the p+-buried layer, SiO$_2$ layer and n+-buried layer.

FIG. 4 illustrates an embodiment of the invention in which a p+-type buried layer 39 and a p-type diffused layer 51 from the surface are coupled together to form an element isolation region 50 to isolate the elements.

FIG. 5 illustrates an embodiment of the invention in which an NMOS element 57 and a bipolar element 59 are provided with an n+-type buried layer 52. Even in these structures, the buried layer is suppressed from swelling under the NMOS elements 46 and 57, to prevent MOS characteristics from deteriorating.

FIG. 6 illustrates further embodiment of the present invention in which the elements are isolated by forming a thick insulating layer that reaches a deep region in a substrate 64 by etching the substrate 64 and burying the insulator. An implanted layer 65 is provided for the buried layer of an NMOS element 70 and a PMOS element 71 only, to prevent MOS characteristics from deteriorating. Further, since the element isolation portions (portions of the buried layers 60 and 63) below the element isolation layer 69 (isolation layer 69 being, for example, an oxide layer, formed by etching the epitaxial layer by a dry etching technique such as reactive ion etching and then burying the oxide layer in the groove formed by the etching) swell greatly relative to the buried layer beneath implanted layer 65, etching of the silicon for forming the element isolation layer 69 need only be performed in small amounts and the thickness of the oxide layer can be decreased, to improve the processing precision.

Figure 7:
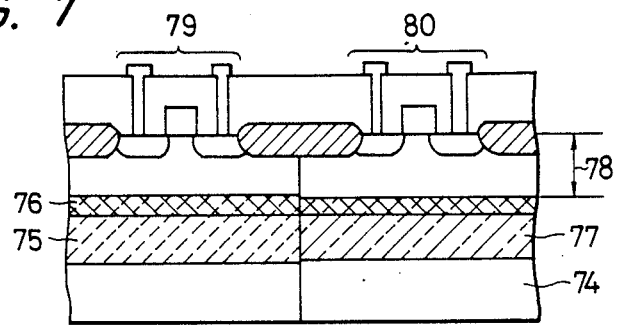

FIG. 7 illustrates an embodiment in which the invention is adapted to a CMOS element which has a buried layer. The epitaxial layer thickness 78 can be decreased since the invention suppresses the auto-doping and swelling of the buried layers 75 and 77. Further, the buried layer having a high concentration helps improve latch-up resistance. In FIG. 7, reference character 74 represents a p-type Si substrate; 76 represents an ion-implanted layer; and 79 and 80 respectively represent portions for forming NMOS and PMOS elements.

Figure 8:
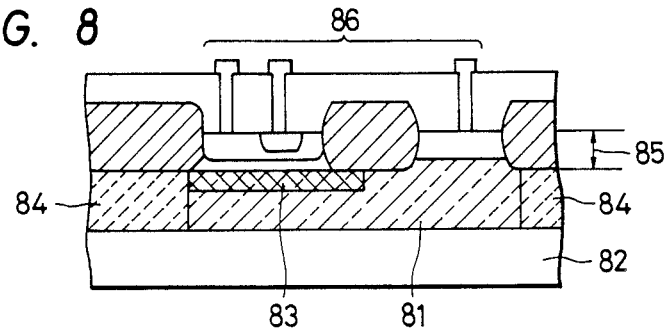

FIG. 8 illustrates an embodiment in which the invention is adapted to a bipolar element having a buried layer. By providing an implanted layer 83 under the base region of the bipolar element (e.g., extending underneath the entirety of the base region), the thickness of the epitaxial layer can be decreased. In order to decrease the collector saturation resistance, furthermore, an n+-type layer must be diffused in the collector electrode so as to reach the n+-type buried layer 81. With the epitaxial thickness being decreased, the heat treatment for n+-type diffusion can be reduced for the collector electrode portion, making it possible to increase the throughput and the degree of integration. In FIG. 8, reference character 82 represents a p-type Si substrate; 84 represents a p+-buried layer; 85 represents the initial thickness of the epitaxial layer; and 86 represents a portion for forming a bipolar transistor.

The same actions and effects are obtained even when the epitaxial layer neighboring the buried layer is provided with the implanted layer. Therefore, the implanted layer may be selectively provided for either the buried layer or the epitaxial layer, as required. Depending upon the circumstances, the implanted layer may be provided for both the buried layer and the epitaxial layer.

According to the present invention which suppresses the buried layer from swelling, the junction capacity of the MOS element decreases, the shifting amount of the threshold voltage decreases, and the atoms of the element that is introduced serve as a barrier against the diffusion of electrons that are generated by alpha particles. Therefore, resistance increases against alpha particles. Further, since the portion of the buried layer for forming the element isolation region swells greatly, the impurity diffused layer is formed from the surface maintaining a reduced thickness, and the element isolation width is reduced correspondingly. Further, since the buried layer as a whole is suppressed from swelling, the epitaxial thickness can be reduced, enabling the bipolar elements to be finely and highly integrated.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein but intend to cover all such modifications as are encompassed by the scope of the appended claims.

What is claimed is:

1. In a semiconductor device in which at least one of a MOS element and a bipolar element is provided in an element-forming region of a semiconductor substrate, and which has a buried layer formed between said element-forming region and a support region therefor, the improvement wherein an impurity-containing semiconductor layer, containing atoms of at least one kind of element selected from the group consisting of oxygen, nitrogen, carbon, argon, neon, krypton and helium, is provided on at least a portion of said buried layer so as to suppress swelling of the buried layer as compared to swelling of the buried layer without said impurity-containing semiconductor layer thereon, and wherein said device includes both a MOS element and a bipolar element, the impurity-containing semiconductor layer being formed only under the MOS element.

2. In a semiconductor device in which at least one of a MOS element and a bipolar element is provided in an element-forming region of a semiconductor substrate, and which has a buried layer formed between said element-forming region and a support region therefore, the improvement wherein an impurity-containing semiconductor layer, containing atoms of at least one kind of element selected from the group consisting of oxygen, nitrogen and carbon, is provided on at least a portion of said buried layer so as to suppress swelling of the buried layer as compared to swelling of the buried layer without said impurity-containing semiconductor layer thereon, and wherein said bipolar element is provided in the element-forming region of the semiconductor substrate, said bipolar element including a collector region, and the buried layer is provided beneath the element-forming region at the location of the bipolar element, the buried layer constituting a collector region of the bipolar element.

3. A semiconductor device according to claim 2, wherein said bipolar element is a bipolar transistor, the bipolar transistor including a base region and emitter region, each provided in said element-forming region, in addition to said collector region.

4. In a semiconductor device in which at least one of a MOS element and a bipolar element is provided in an element-forming region of a semiconductor substrate, and which has a buried layer formed between said element-forming region and a support region therefor, the improvement wherein both the MOS element and the bipolar element are provided in the element-forming region of the semiconductor substrate, and wherein an impurity-containing semiconductor layer, containing atoms of at least one kind of element selected from the group consisting of oxygen, nitrogen and carbon is provided on at least a portion of said buried layer so as to suppress swelling of the buried layer as compared to swelling of the buried layer without said impurity-containing semiconductor layer thereon, the impurity-containing semiconductor layer being provided only under the MOS element.

5. In a semiconductor device in which at least one of a MOS element and a bipolar element is provided in an element-forming region of a semiconductor substrate, and which has a buried layer formed between said element-forming region and a support region therefor, the improvement wherein an impurity-containing semiconductor layer, containing atoms of at least one kind of element selected from the group consisting of oxygen, nitrogen and carbon is provided on at least a portion of said buried layer so as to suppress swelling of the buried layer as compared to swelling of the buried layer without said impurity-containing semiconductor layer thereon, the impurity-containing semiconductor layer thereon, the impurity-containing semiconductor layer being provided across the entire semiconductor substrate.

6. In a semiconductor device in which at least one of a MOS element and a bipolar element is provided in an element-forming region of a semiconductor substrate, and which has a buried layer formed between said element-forming region and a support region therefor, the improvement wherein the device includes at least two MOS elements, a PMOS element and an NMOS element, whereby CMOS structure is provided in the substrate, wherein an impurity-containing semiconductor layer, containing atoms of at least one kind of element selected from the group consisting of oxygen, nitrogen and carbon is provided on at least a portion of said buried layer so as to suppress swelling of the buried layer as compared to swelling of the buried layer without said impurity-containing semiconductor layer thereon, and wherein said impurity-containing semiconductor layer is located underneath both said PMOS element and said NMOS element.

* * * * *